United States Patent [19]

Luhman et al.

[11] Patent Number: 5,398,840
[45] Date of Patent: Mar. 21, 1995

[54] MICROPARTICLE ENHANCED FIBROUS CERAMIC BAFFLE FOR CRYOGENIC LIQUID CONTAINERS

[75] Inventors: Thomas S. Luhman, Bellevue; Anna L. Baker; Darryl F. Garrigus, both of Seattle, all of Wash.

[73] Assignee: The Boeing Company, Seattle, Wash.

[21] Appl. No.: 68,272

[22] Filed: May 24, 1993

Related U.S. Application Data

[63] Continuation of Ser. No. 560,382, Jul. 31, 1990, abandoned, which is a continuation-in-part of Ser. No. 381,498, Jul. 18, 1989, abandoned, which is a continuation-in-part of Ser. No. 698,496, Feb. 5, 1985, Pat. No. 5,041,321, which is a continuation-in-part of Ser. No. 667,568, Nov. 2, 1984, abandoned.

[51] Int. Cl.⁶ .............................................. B65D 6/00
[52] U.S. Cl. ..................................... 220/563; 62/45.1; 210/508
[58] Field of Search ................. 210/508, 509, 510.1, 210/490, 653; 220/563; 62/45.1

[56] References Cited

U.S. PATENT DOCUMENTS

| | | | |
|---|---|---|---|
| 1,477,686 | 12/1923 | Braender | 220/563 |
| 2,379,126 | 6/1945 | Welden | 220/563 |
| 2,840,259 | 6/1958 | Steidl | 220/563 |
| 2,927,711 | 3/1960 | Naggiar | 220/563 |
| 3,330,697 | 7/1967 | Pechini . | |
| 3,640,093 | 2/1972 | Levene . | |
| 3,702,279 | 11/1972 | Ardary . | |
| 3,819,468 | 6/1974 | Sauder . | |
| 3,935,060 | 1/1976 | Blome . | |
| 3,952,823 | 4/1976 | Hinderks | 180/64 A |
| 4,238,257 | 12/1980 | Remi . | |
| 4,395,468 | 7/1983 | Zsenberg | 429/31 |
| 4,452,832 | 6/1984 | Wrenn, Jr. . | |
| 4,520,082 | 5/1985 | Makiel | 429/26 |
| 4,614,673 | 9/1986 | Bendig . | |
| 4,624,271 | 2/1989 | Rice . | |
| 4,640,875 | 2/1987 | Makiel | 429/30 |
| 4,664,986 | 5/1987 | Draper et al. | 429/26 |
| 4,693,865 | 9/1987 | Goto . | |
| 4,743,340 | 5/1988 | Wrenn, Jr. . | |
| 4,764,357 | 8/1988 | Sherif et al. . | |
| 4,769,346 | 9/1988 | Gadkaree . | |
| 4,770,930 | 9/1988 | Wrenn, Jr. . | |
| 4,784,686 | 11/1988 | Meek . | |
| 4,797,378 | 1/1989 | Sowman . | |
| 4,804,649 | 2/1989 | Sherif . | |
| 4,818,448 | 4/1989 | Wrenn, Jr. . | |
| 4,828,774 | 5/1989 | Andersson . | |
| 4,849,276 | 7/1989 | Bendig . | |
| 4,861,753 | 8/1989 | McCarron, III . | |
| 4,882,304 | 11/1989 | Novich . | |
| 4,892,862 | 1/1990 | Ogushi . | |
| 5,000,998 | 3/1991 | Bendig . | |
| 5,009,822 | 4/1992 | Sacks . | |
| 5,021,369 | 6/1991 | Ackerman . | |
| 5,041,321 | 8/1991 | Bendig . | |

FOREIGN PATENT DOCUMENTS

| | | |
|---|---|---|
| 63-248022 | 4/1987 | Japan . |
| 1131025 | 11/1987 | Japan . |
| 3248022A | 10/1988 | Japan . |
| 1131025A | 5/1989 | Japan . |

OTHER PUBLICATIONS

*NASA Tech Brief* (Apr. '89) p. 88 "Surface Tension Confines Cryogenic Liquid", Goddard Space Flight Center.
*NASA Tech Brief* (Nov. '89) p. 52 "Ceramic Wick for Capillary-Pump Heat Pipe", Goddard Space Flight Center.
*NASA Tech Brief* (Sep. '89) p. 84 "Capillary-Pumped Heat-Transfer Loop", Marshall Space Flight Center.
*NASA Tech Brief* (Sep. '89) p. 94, "Two-pipe Heat-Transfer Loop", NASA Jet Propulsion Laboratory.

(List continued on next page.)

Primary Examiner—Joseph Man-Fu Moy
Attorney, Agent, or Firm—John C. Hammar

[57] ABSTRACT

A ceramic composite comprising ceramic fibers and glass microparticles bound together as a porous matrix with a ceramic binder provides baffles for cryogenic fluids in a storage container.

10 Claims, 1 Drawing Sheet

OTHER PUBLICATIONS

*Japanese Journal of Applied Physics* vol. 26, No. 4, Apr. 1987, pp. L399–L401, "Preparation of $(la_{1-x}Sr_x)_2CuO_{4-\delta}$ Superconducting Films by Screen Printing Method", Koinuma, et al.

*Am. Ceramic Soc. Bulletin*, vol. 67, No. 4, 1988, pp. 759–762 "Dissolution of $YBa_2Cu_2O_{(7-x)}$ in Various Solvents", Trolier, et al.

Ostertag, Ceramic Powder Science II. A. vol. 1., Nov. 19 pp. 501–510, American Ceramic Society.

Eror, et al., Proc. of Materials Research Society, *Better Ceramics Through Chemistry*, C. G. Brinker, et al. (eds.).

*Japonese Journal of Applied Physics*, vol. 26, No. 5, May 1987, pp. L761–L762, "High $T_c$ Superconductivity in Screen Printed Yb–Ba–Cu–O films" Koinuma et al.

1986 "Polymeric Precursors Synthesis of Ceramic Metals".

Wang, et al. 26 Inorganic Chem. 1474 (1987).

Pope, et al., "Organometallic Polymer Route to Superconducting Ceramics; Chemistry and Fabrication of Wires and Coatings", *High Temperature Superconductors II* (D. Capone, et al. (eds.), Apr. 5–8, 1988, p. 97.

Liu, et al., 99 *Matl. Res. Soc. Symposium Proceedings* 253 (Nov. 30–Dec. 4, 1987.

Chiang, et al. 99 Matl. Res. Soc. Symp. Proceedings 307 (Nov. 30–Dec. 4, 1987).

Yurek, et al., J. Electrochem. Soc., 134 (10) 2634 (Oct. 1987).

Uchikawa, et al., High–Temperature Conductors II (D. Capone, et al. (eds.) Apr. 5–8, 1988, p. 89.

Barboux, et al. "The Preparation of Bulk and Thick Films of $YBa_2Cu_3O_{7-y}$ using a Solution Technique", Materials Research Society Symposium Proceedings, vol. 99, Brodsky, M. B., et al., ed., pp. 49–55.

U.S. Patent     Mar. 21, 1995     5,398,840
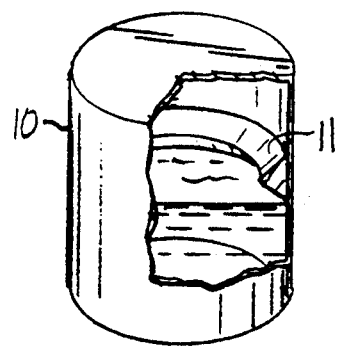
FIG._1.
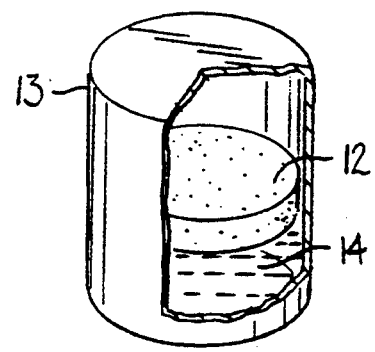
FIG._2.
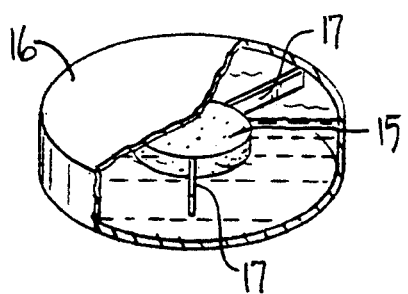
FIG._3.
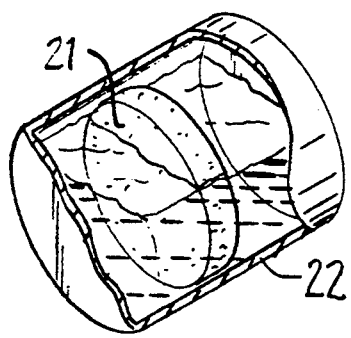
FIG._5.
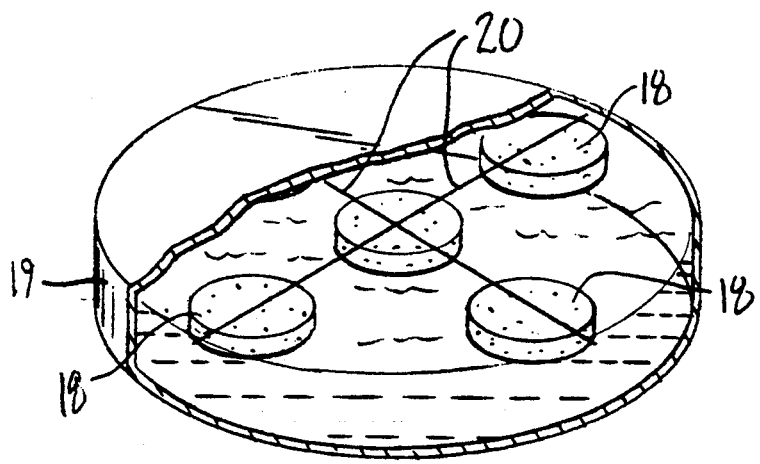
FIG._4.

MICROPARTICLE ENHANCED FIBROUS CERAMIC BAFFLE FOR CRYOGENIC LIQUID CONTAINERS

This application is a continuation of Ser. No. 07/560,382, filed Jul. 31, 1990, now abandoned, which is a continuation-in-part of Ser. No. 07/381,498, now abandoned, filed Jul. 18, 1989, which is a continuation-in-part of Ser. No. 06/698,496, filed Feb. 5, 1985, U.S. Pat. No. 5,041,34, which is a continuation-in-part of Ser. No. 667,568, filed Nov. 2, 1984, now abandoned.

This invention was made with government support under Contract No. F49620-88-C-0143 awarded by the Air Force. The Government has certain rights in this invention.

TECHNICAL FIELD

This invention relates generally to baffles made of fibrous ceramic materials which are wickable to cryogenic liquids.

BACKGROUND OF THE INVENTION

Our prior application referenced above, describes fibrous ceramic insulation materials formed by dispersing a suspension of ceramic fibers over a form-defining surface, drying the fibers to form a mat, solidifying the mat by soaking it with a sol-gel ceramic precursor, and then drying and curing the sol-gel precursor. The present invention is directed to baffles comprising an improved fibrous ceramic.

In NASA Tech Brief (April 1989), p. 88, entitled "Surface Tension Confines Cryogenic Liquid" by Goddard Space Flight Center, there is disclosed a Dewar containing an all-silica, open-cell sponge which is immune to cryogenic temperatures. The average pore size is small enough to ensure the cryogen is prevented from sloshing during orientation, gravitation and/or acceleration changes.

The present invention utilizes glass microballoons and/or diatoms with a fibrous ceramic, which is set after impregnation with a sol-gel. Glass microballoons are usually about 5-200 microns in diameter and are hollow. Various glasses with different wall thicknesses (in the case of hollow spheres) can be used to obtain the desired mechanical strength. In place of, or in combination with microballoons, diatoms may be used. Diatoms are porous silica inner support structures of certain marine and fresh water algae, having typical size ranges of 5-50 microns.

We have found that the rigidized fiber mat made in accordance with our prior application consists of fibers which are randomly tangled, most of which are oriented in the x-y plane (the z-axis being aligned with the thickness of the mat). When bound with the sol-gel binder, the random three dimensional network provides a material, with a porosity of about 90-95%. However, the voids between the ceramic fibers are filled by microballoons and/or diatoms, thus further rigidizing the structure. The mechanical compression strength is increased as the fibers are supported by the microballoons (and/or diatoms). Isotropic structural properties (i.e., similar properties in the x-y, x-z and y-z planes) are also more closely approximated. Typical densities of the fibrous ceramic are in the range of 15-23 lb/ft$^3$. The useful range may be tailored to be as low as about 7 lb/ft$^3$. Lower densities may be achieved by substituting lower density microballoons and/or diatoms for higher density binder to achieve an increased strength-to-weight ratio. Selected densities may be achieved for specific applications. The processing time for preparing the ceramic material is substantially reduced, usually by one-half, over the time for making an all fibrous structure without sacrificing strength. Furthermore, problems associated with handling ammonia (used to cure the sol-gel binder) are reduced. In certain applications, the ceramic according to the present invention has a lower dielectric constant than that of the fibrous ceramic of our prior application. For example, at microwave frequencies, ceramic composites according to our prior application have dielectric constants around 1.4, whereas composites of the present invention have dielectric constants around 1.2.

A significant advantage of the improved ceramic is its wickability, especially its wickability to cryogenic fluids, such as liquid oxygen, liquid hydrogen, etc.

The present invention provides internal baffles that are cryogenically compatible with fluids such as liquid fuel for rockets, liquid nitrogen, liquid helium, etc. Such baffles are particularly important to prevent the fuel in an aircraft or space craft from adverse movements which affect the structural integrity and flight characteristics of the craft.

One of the problems with fuel storage in a vehicle is the maintenance of proper readings from electronic sensors regarding fuel level and flow. Particularly in aircraft, the lower the fuel level in a tank, the more critical it is to have accurate information on the remaining amount of fuel. Accordingly, a primary problem is the turbulence at or near the liquid surface, since most fuel level sensors are designed to measure fuel volume as a function of liquid level in a tank. Baffles provided by the present invention may either be permanently attached to the sides of a tank to minimize surface turbulence, or may be moveable to follow the liquid level of the fuel.

SUMMARY OF THE INVENTION

The microparticles enhanced fiber ceramic (hereinafter sometimes abbreviated as MEFC) provides baffles for containers of cryogenic fluids or filters for such fluids. The invention is particularly applicable for containers for cryogenic fluids such as the liquid propellants, liquid oxygen and liquid hydrogen, especially where the containers for these liquids are subject to rapid motion, such as in an aircraft or space craft. Baffles, provided in various possible configurations, are disposed within a container of the cryogenic fluid to control surface turbulence and rapid shift of the level of fluid within the container.

The microparticle enhanced fiber ceramic is made by forming a slurry comprising ceramic fibers and microparticles, preferably glass microballoons and or diatoms, in a liquid; dispersing the slurry over a form-defining surface and separating the liquid therefrom to form a wet mat of fibers and glass microparticles; drying the mat; soaking the mat with a sol-gel ceramic precursor binder; and drying and curing the binder and mat at a sufficient temperature and for a sufficient period of time to convert the sol-gel precursor to ceramic, thereby forming the microballoon enhanced fibrous ceramic. The glass microparticles are preferably glass microballoons which are therefore hollow, but solid microparticles may also be used. These microballoons have a crush strength in the range of about 500 to 4500 psi and are commercially available. The sol-gel binder is preferably an alumina precursor, but other sol gel precursors may be used. Additives may be utilized in addition to the ceramic fiber and microballoons, such as single crystal whiskers (silicon carbide, silicon nitride, alumina, etc.) and diatoms which may impart desirable properties to the MEFC, such as to increase thermal resistance and bulk porosity, and to reduce weight.

BRIEF DESCRIPTION OF THE DRAWINGS

FIG. 1 is an illustration of a container having an annular shaped baffle of MEFC material.

FIG. 2 is an illustration of a container having a free floating MEFC baffle in the cryogenic fluid.

FIG. 3 is an illustration of a baffle of MEFC material held within the container by tensioning cords.

FIG. 4 is an illustration of a plurality of MEFC baffles held in place within the interior volume of a container by tensioning cords.

FIG. 5 is an illustration of MEFC filter for cryogenic fluids.

DETAILED DESCRIPTION OF THE INVENTION

One component of the MEFC is ceramic fiber. Ceramic fibers are known and many are commercially available. Preferably the ceramic fibers will be aluminosilicate fibers, but other fibers may be utilized including, but not limited to, fibers of silica, alumina, boroaluminasilica (commercially available under the trademark Ultrafiber ® 440 from 3-M Company), zirconia, silicon nitride, and mixtures thereof. The fibers are available in various dimensions, usually from about 0.3 to 4 inches in length (the longest dimension of the fiber) and 1 to 10 microns in diameter. It should be realized that the dimensions of the fibers can generally be tailored to meet the physical characteristics which are desired in terms of weight, porosity, etc.

The glass microballoons are commercially available in many sizes and are generally hollow spheres, made from various types of glass compositions with various wall thicknesses, usually in the size of about 5 to 200 microns in diameter. Solid spheres may also be utilized in place of or in addition to the hollow microballoons. As in the case of the fibers, the size of the microballoons will in part determine the physical characteristics of the MEFC. Preferably, the microballoons should be in a range of about 5 to 50 microns, which appears to be the preferred size for filling voids between the fibers. In some cases the MEFC may consist entirely of microballoons.

Typically, an aqueous slurry of the ceramic fibers and microballoons are mixed to provide a substantially uniform dispersion. The concentration of the slurry is not particularly critical but, for convenience, the slurry will generally comprise from up to 10 wt % of the fibers, up to 10 wt % of the microballoon and/or diatoms (based on the total weight of the slurry). The slurry may contain from 0-99 wt % of ceramic fibers and from 1-100 wt % microparticles, based on the combined weight of fibers and microparticles.

Diatoms may be used in the slurry. The extremely fine porosity of the diatoms may increase the bulk porosity, which allows for higher cryogen incorporation per volume and smaller, more controlled porosity for gas/liquid interface control for membrane applications. The diatoms may comprise up to 100% by weight of the combined weight of the fiber and microparticles (microballoons and diatoms).

After the slurry has been thoroughly mixed, it is poured over a form-defining mold (usually porous enough to allow passage of the water therethrough but not the fibers or microballoons) which may be flat, irregular, curved, or virtually of any size or shape. The water is then removed typically by vacuum through the porous mold thereby forming a wet mat. The mat is then dried, usually at a temperature of up to about 200° F., to remove the water. Duration of the drying will, of course, depend upon the size and shape of the mat.

Once the mat has been dried, a sol-gel binder is introduced, usually in incremental stages, although a single stage application may be utilized in some instances. The binder is preferably an alumina sol-gel glass that can be prepared by techniques, such as those disclosed in our prior application. Other sol-gel glasses may be utilized, such as silica sol-gel glass or sol-gel glass of similar compositions to the particular fiber in the mat. Incremental addition of the binder involves repeating the steps of impregnating the mat with the binder, gelling the binder and curing the mat and binder. Usually a light coating of binder is applied in the first stage followed by an air dried gellation to dimensionally stabilize the fiber mat. Thereafter, the steps of impregnating, gelling and curing are repeated one or more times until the total desired amount of binder has been added. Typically about 15 to 300 wt % of binder is used based on the initial weight of fibers and microballoons in the mat. The impregnating step may be accomplished by wicking, spraying, vacuum infiltrating, and the like.

After impregnation, the binder is converted to a rigid gel, usually by air drying or by subjecting the binder-impregnated mat to an atmosphere of ammonia gas. Since the ammonia-sol reaction is exothermic, there is a tendency for bubbles to form in the mat which can be avoided, however, by allowing the first batch of binder to gel in air. The sol-gel binder is preferably an alumina sol-gel glass that can be prepared using conventional techniques. Other sol-gel glasses may be utilized, for example a silica sol-gel glass or a sol-gel glass of similar composition to the particular fiber in the mat may be used.

After gelling the binder, the mat is cured, preferably by heating to about 200° F. for several hours (about four hours is preferred), then by slowly increasing the temperature to about 600° F. for a longer period of time (usually about five hours), and finally by rapidly reducing the temperature.

In addition to the ceramic fibers and microballoons, the slurry may also contain additives which can alter the physical characteristics of the MEFC. For example, by adding small ceramic whiskers (about 0.4 to 1 micron in diameter, 100:1 aspect ratio average) in small amounts (usually about 5 to 30% by combined weight of the fibers and microparticles), the compression strength and modulus of the MEFC may be increased. Preferably, whiskers of silicon carbide of about 0.4 to 1 micron in diameter are useful for this purpose.

Referring to the figures, in FIG. 1 is shown a container 10 having a wedge shaped baffle 11 made of MEFC material according to the present invention. The baffle may be mounted to the interior surface of the container in any convenient way, such as by use of tracks (not shown) on the interior surface. Thus, the density of the MEFC will be selected such that the baffle 11 will float and follow the liquid level in the container 10 as the liquid is withdrawn. A wedge-shaped baffle may be made by molding the ceramic directly into such shape or by appropriate machining of a block of MEFC material.

Referring to FIG. 2, there are shown a disk-shaped baffle 12 of MEFC material in a container 13. As described above, the density of the MEFC material can be controlled within certain parameters. In FIG. 2 the effective bulk density of the MEFC material is such that it is less than that of the cryogenic fluid 14 within the container and therefore floats on the cryogenic fluid to serve an anti-slosh function.

Referring to FIG. 3 there is shown a baffle which is a disk 15 held within the volume of the enclosed interior of a shallow disk-shaped container 16 by a plurality of tensioning cords or other stiffener 17. Since container 16 is round, wave motion of a liquid contained therein tends to converge near the center of the liquid surface, thereby making disk 15 most effective when it is centrally located. Since container 16 has a shallow depth, it is not necessary that cords 17 be movably attached to the sides of container 16. The tensioning in cords 17 and weight of disk 15 may be selected so that the vertical degree of freedom of disk 15 allows it to float in the liquid surface at all levels within container 16.

Referring to FIG. 4 there is shown a plurality of MEFC baffle disks 18 held in position within the interior of a container 19 by a plurality of tensioning cords 20. This is a modification of FIG. 3 wherein additional MEFC disks are used near the sides of the container 19 for better control of surface turbulence.

Referring to FIG. 5 there is shown a disk 21 of MEFC material circumferentially affixed to the interior of a cylindrical flow line 22, thereby providing a filter through which cryogenic fluids are passed. In this configuration, the purpose of the MEFC is to prevent particulate matter from flowing downstream into the system utilizing a liquid.

Many other configurations of baffles and filters of MEFC material will be apparent to those of ordinary skill in the art from the above disclosure and the claims and from practice of the invention, and which are within the spirit and scope of the present invention.

What is claimed is:

1. A container for storing liquid cryogens comprising:
    walls defining an enclosed volume suitable for storing a cryogenic fluid;
    a cryogenic fluid within the enclosed volume; and
    at least one fibrous ceramic baffle positioned within said volume in contact with the cryogenic fluid to control surface turbulence in the cryogenic fluid and rapid shift of the level of fluid within the container.

2. A container according to claim 1 wherein said baffle comprises a composite material selected from the group consisting of ceramic fibers, microparticles, or mixtures thereof felted into a porous mat and bound together in a ceramic binder to form a porous matrix.

3. A container according to claim 2 having a cylindrical shape wherein said baffle comprises an annular rib located on the interior surface of said container.

4. A container according to claim 2 wherein said baffle comprises a slab having a specific gravity sufficient to float in the cryogenic fluid in said container.

5. A container according to claim 2 wherein said baffle comprises a slab attached to the interior surface of said container by a plurality of tensioning means for retaining said slab at a predetermined location on the surface of a cryogenic fluid in said container.

6. A container according to claim 5 accommodating a plurality of said slabs.

7. A container according to claim 2 wherein said composite comprises microparticles.

8. A container according to claim 2 or 7 wherein said microparticles comprise glass microballoons.

9. A container according to claim 2 or 7 wherein said microparticles comprise diatoms.

10. A container according to claim 2 wherein said fibers are selected from the group consisting of aluminosilicate, silica, alumina, boroaluminasilica, zircona, silicon nitride and mixtures of any two or more thereof.

* * * * *